(12) United States Patent
Park et al.

(10) Patent No.: US 9,646,718 B2
(45) Date of Patent: May 9, 2017

(54) SEMICONDUCTOR MEMORY DEVICE HAVING SELECTIVE ECC FUNCTION

(71) Applicant: Samsung Electronics Co., Ltd., Suwon-si, Gyeonggi-do (KR)

(72) Inventors: Jong-wook Park, Suwon-si (KR); Ki-won Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 109 days.

(21) Appl. No.: 14/636,548

(22) Filed: Mar. 3, 2015

(65) Prior Publication Data

US 2016/0034348 A1 Feb. 4, 2016

(30) Foreign Application Priority Data

Aug. 1, 2014 (KR) .................. 10-2014-0099241

(51) Int. Cl.
| | |
|---|---|
| *G11C 29/00* | (2006.01) |
| *G11C 29/52* | (2006.01) |
| *G11C 16/04* | (2006.01) |
| *G11C 29/42* | (2006.01) |
| *G11C 29/44* | (2006.01) |

(Continued)

(52) U.S. Cl.
CPC .......... *G11C 29/52* (2013.01); *G06F 11/1048* (2013.01); *G11C 11/406* (2013.01); *G11C 16/0466* (2013.01); *G11C 29/42* (2013.01); *G11C 29/44* (2013.01); *G11C 29/50016* (2013.01); *G11C 29/783* (2013.01); *G11C 2211/4062* (2013.01)

(58) Field of Classification Search
CPC ... G11C 29/42; G11C 29/44; G11C 29/50016; G11C 29/783; G11C 29/52; G11C 2211/4062; G11C 16/0466; G11C 11/406; G06F 11/1068
See application file for complete search history.

(56) References Cited

U.S. PATENT DOCUMENTS

| | | |
|---|---|---|
| 5,603,042 A | 2/1997 | Kabenjian |
| 5,737,627 A | 4/1998 | Kabenjian |

(Continued)

FOREIGN PATENT DOCUMENTS

| | | |
|---|---|---|
| JP | 1999-242899 A | 9/1999 |
| KR | 1019990023208 A | 3/1999 |

(Continued)

*Primary Examiner* — Guy Lamarre
(74) *Attorney, Agent, or Firm* — Harness, Dickey & Pierce, P.L.C.

(57) ABSTRACT

A semiconductor memory device having a selective error correction code (ECC) function is provided. The semiconductor memory device divides a memory cell array into blocks according to data retention characteristics of memory cells. A block in which there are a plurality of fail cells generated at a refresh rate of a refresh cycle that is longer than a refresh cycle defined by the standards of the semiconductor device is selected from among the divided blocks. The selected block repairs the fail cells by performing the ECC function. The other blocks repair the fail cells by using redundancy cells. Accordingly, a refresh operation is performed on the memory cells of the memory cell array at the refresh rate of the refresh cycle that is longer than the refresh cycle by the standards of the semiconductor device.

23 Claims, 9 Drawing Sheets

(51) Int. Cl.
  *G11C 29/50*   (2006.01)
  *G11C 11/406*   (2006.01)
  *G06F 11/10*   (2006.01)

(56) References Cited

U.S. PATENT DOCUMENTS

| | | |
|---|---|---|
| 5,915,126 A | 6/1999 | Maule et al. |
| 6,219,807 B1 | 4/2001 | Ebihara et al. |
| 6,662,333 B1 | 12/2003 | Zhang et al. |
| 7,552,274 B2 | 6/2009 | Estakhri et al. |
| 7,739,576 B2 | 6/2010 | Radke |
| 7,797,609 B2 | 9/2010 | Neuman |
| 8,112,699 B2 | 2/2012 | Godard et al. |
| 8,136,017 B2 | 3/2012 | Oh et al. |
| 8,640,005 B2 | 1/2014 | Wilkerson et al. |
| 2005/0124116 A1* | 6/2005 | Hsu ............... H01L 27/0688 438/257 |
| 2005/0281113 A1 | 12/2005 | Yada et al. |
| 2008/0046778 A1* | 2/2008 | Yoshida ............ G06F 11/1068 714/5.1 |
| 2013/0139029 A1* | 5/2013 | Pawlowski ........ G06F 11/1044 714/754 |

FOREIGN PATENT DOCUMENTS

| | | |
|---|---|---|
| KR | 100296517 B1 | 5/2001 |
| WO | WO-94-12935 A1 | 6/1994 |

\* cited by examiner

SEMICONDUCTOR MEMORY DEVICE HAVING SELECTIVE ECC FUNCTION

CROSS-REFERENCE TO RELATED APPLICATION

This application claims the benefit of Korean Patent Application No. 10-2014-0099241, filed on Aug. 1, 2014, in the Korean Intellectual Property Office, the disclosure of which is incorporated herein in its entirety by reference.

BACKGROUND

The inventive concept relates to a semiconductor memory device, and more particularly, to a semiconductor memory device having a selective ECC function for reducing refresh current and refresh power.

Semiconductor memory devices are used in a wide variety of electronic devices. Portable devices that are battery driven, such as mobile phones, smart phones, and personal digital assistants (PDAs) may benefit from semiconductor memory devices that consume relatively low amounts of power. Volatile memory devices, such as dynamic random access memory (DRAM), among semiconductor memory devices, may perform a refresh operation to retain stored data. As the memory capacitance increases, the refresh time of memory cells may also increase. When the refresh time of the memory cells of the DRAM increases, refresh current and refresh power of the memory cells may increase.

SUMMARY

Some example embodiments relate to a semiconductor memory device capable of reducing refresh current and refresh power by using a selective ECC function, and a method of operating the same.

According to some example embodiments, the semiconductor memory device may include: a memory cell array including a plurality of memory cells and divided into blocks according to data retention characteristics of the plurality of memory cells; an error correction code (ECC) cell array for storing parity bits; an ECC controller for storing information with respect to an ECC select block which is set to perform an ECC function from among the divided blocks of the memory cell array and providing an ECC control signal; and an ECC engine for generating the parity bits with respect to the ECC select block, in response to the ECC control signal.

The ECC select block may be set according to a distribution of fail cells according to a refresh rate of a refresh cycle that is longer than a refresh cycle defined by the standards of the semiconductor memory device.

The semiconductor memory device may further include a refresh address generator for generating a refresh address to perform a refresh operation on the plurality of memory cells at the refresh rate.

The other blocks of the divided blocks of the memory cell array, except the ECC select block, may repair fail cells by using a redundancy cell of the memory cell array.

The ECC controller may include a block storing unit for storing the information with respect to the ECC select block, and a comparator for comparing block information stored in the block storing unit with an access address received from the outside to output the ECC control signal.

The ECC controller may include a block storing unit for storing the information with respect to the ECC select block, an address storing unit for storing an address of fail cells of the ECC select block, and a comparator for comparing block information stored in the block storing unit and the address of the fail cells stored in the address storing unit with an access address received from the outside to output the ECC control signal.

The ECC engine may include an ECC encoding circuit for generating the parity bits with respect to write data to be written to the plurality of memory cells of the ECC select block, in response to the ECC control signal, and an ECC decoding circuit for correcting error bit data by using read data read from the plurality of memory cells of the ECC select block and the parity bits read from the ECC cell array, and outputting the corrected error bit data.

The ECC engine may include an ECC encoding circuit for generating the parity bits with respect to write data to be written to the plurality of memory cells including fail cells of the ECC select block, in response to the ECC control signal, and an ECC decoding circuit for correcting error bit data by using read data read from the plurality of memory cells including the fail cells of the ECC select block and the parity bits read from the ECC cell array, and outputting the corrected error bit data.

At least some example embodiments relate to a method of operating a semiconductor memory device.

In some example embodiments, the method includes: setting n refresh rates (n is a natural number that is 2 or greater) for testing data retention characteristics of memory cells of a memory cell array; testing the memory cells according to the n refresh rates; dividing the memory cell array into blocks by comparing the number of first fail cells generated at an n–1th refresh rate and the number of second fail cells generated at an nth refresh rate, as a result of the test; repairing the first fail cells by using a redundancy cell in a first block, in which there are a higher number of the first fail cells than the second fail cells, as a result of the comparison; and performing an error correction code (ECC) operation on a second block, in which there are a higher number of the second fail cells than the first fail cells, as a result of the comparison.

The method may further include performing a refresh operation on the memory cells of the memory cell array at the nth refresh rate.

The nth refresh rate may have a refresh cycle that is longer than a refresh cycle of the n–1th refresh rate and the n–1th refresh rate may have a refresh cycle that is longer than a refresh cycle defined by the specification of the semiconductor memory device.

The method may further include storing information with respect to the second block in a block storing unit; and comparing block information stored in the block storing unit with an access address received from the outside, and as a result of the comparison, outputting an ECC control signal for performing the ECC operation.

The method may further include generating parity bits with respect to write data to be written to the memory cells of the second block, in response to the ECC control signal, and storing the parity bits in an ECC cell array; and correcting error bit data by using read data read from the memory cells of the second block and the parity bits read from the ECC cell array in response to the ECC control signal, and outputting the corrected error bit data.

The method may further include storing information with respect to the second block in a block storing unit; storing an address of the second fail cells of the second block in an address storing unit; and comparing block information stored in the block storing unit with an access address received from the outside, and as a result of the comparison, outputting an ECC control signal for performing the ECC function.

The method may further include generating parity bits with respect to write data to be written to the second fail cells of the second block, in response to the ECC control signal, and storing the parity bits in an ECC cell array; and correcting error bit data by using read data read from the second fail cells of the second block and the parity bits read from the ECC cell array in response to the ECC control signal, and outputting the corrected error bit data.

In some example embodiments, the semiconductor memory device may include a memory cell array arranged in blocks, each of the blocks having memory cells therein, each of the memory cells having an associated amount of retention time the memory cell can store data without a refresh operation before failing; and a processor and a memory, the memory containing computer readable code that, when executed by the processor, configures the processor to, determine the retention time of the memory cells at at least two different refresh rates, assign one of the blocks having a greater number of memory cells with a relatively lower retention time as a first block, and assign one of the blocks having a greater number of memory cells with a relatively higher retention time as a second block, and repair fail cells in the first and second block while operating the memory cell at a higher one of the at least two different refresh rates.

In some example embodiments, the processor is configured to repair the fail cells by, repairing the fail cells of the first block by substituting the fail cells of the first block with redundancy cells associated therewith; and repairing the fail cells of the second block using an error correction code (ECC).

In some example embodiments, the fail cells of the first block are not repaired using the ECC.

In some example embodiments, the processor is configured to, store, in the memory, information indicating which of the blocks is the second block, and selectively perform an ECC operation using the ECC code based on the information and an address associated with an access request.

In some example embodiments, the information is a most significant bit of the second block.

BRIEF DESCRIPTION OF THE DRAWINGS

Example embodiments will be more clearly understood from the following detailed description taken in conjunction with the accompanying drawings in which.

DETAILED DESCRIPTION OF THE EMBODIMENTS

Figure 1:
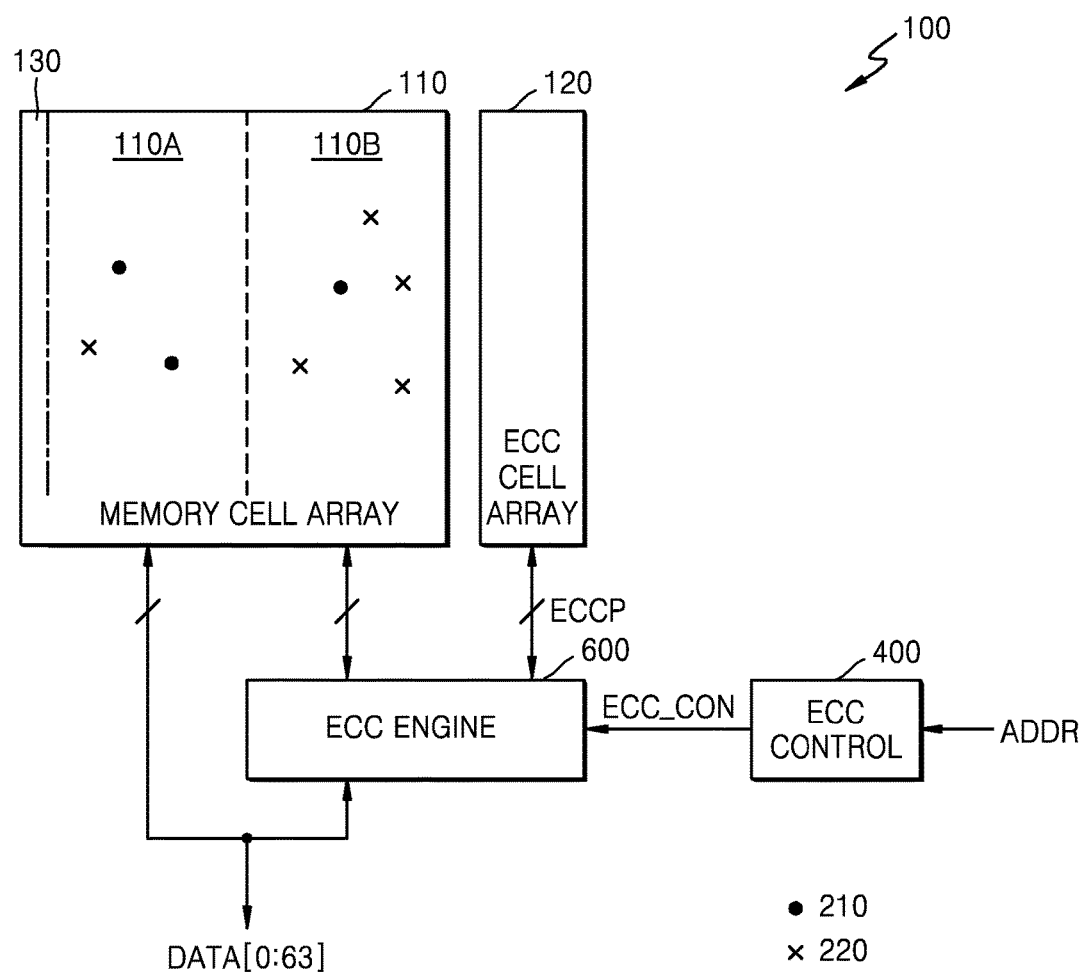
FIG. 1 is a diagram of a semiconductor memory device capable of performing a selective ECC function, according to some example embodiments.

Some example embodiments now will be described more fully hereinafter with reference to the accompanying drawings, in which elements of the invention are shown. The example embodiments may, however, be embodied in many different forms and should not be construed as limited to the example embodiments set forth herein. Rather, these example embodiments are provided so that this disclosure will be thorough and complete, and will fully convey the scope of the inventive concept to one of ordinary skill in the art. In the drawings, the same reference numerals denote the same elements and the thicknesses of layers and regions and the sizes of components may be exaggerated for clarity. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of this disclosure. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

Meanwhile, the terminology used herein is for the purpose of describing particular embodiments only and is not intended to be limiting of exemplary embodiments. As used herein, the singular forms "a", "an", and "the" are intended to include the plural forms as well, unless the context clearly indicates otherwise. It will be further understood that the terms "comprises" and/or "comprising" used herein specify the presence of stated features, integers, steps, operations, members, components, and/or groups thereof, but do not preclude the presence or addition of one or more other features, integers, steps, operations, members, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Various example embodiments will now be described more fully with reference to the accompanying drawings in which some example embodiments are shown. In the drawings, the thicknesses of layers and regions are exaggerated for clarity.

FIG. 1 is a diagram of a semiconductor memory device 100 capable of performing a selective ECC function, according to some example embodiments.

Referring to FIG. 1, the semiconductor memory device 100 includes a memory cell array 110, an error correction code (ECC) cell array 120, an ECC controller 400, and an ECC engine 600.

The memory cell array 110 includes a plurality of memory cells arranged in columns and rows. Each of the plurality of memory cells of the memory cell array 110 is formed of a capacitor and a transistor for storing a charge corresponding to data. The memory cell of the semiconductor memory device 100 may operate to write data by a charge stored in the capacitor. The memory cell array 110 may be a dynamic random access memory (DRAM).

As process scaling of DRAM continues, a capacitance of the capacitor may decrease. Further, over time, the charge stored in the capacitor may dissipate due to a leakage current of the capacitor even when there are no reading and writing operations being performed. Accordingly, a bit error rate (BER) may increase, and thus, the reliability of data stored in the memory cell may deteriorate. To reduce the deterioration of the data, the DRAM may perform a refresh operation to retain data stored in the memory cell.

As the memory capacitance of DRAM increases, the time required to perform the refresh operation on the memory cells, known as the refresh time, may increase. Conventionally, as the refresh time of the memory cells increases, refresh current and refresh power of the memory cells may increase. In contrast, in one or more example embodiments, the semiconductor memory device 100 is configured to operate at a relatively longer refresh time by utilizing a selective ECC function to repair failed cells, therefore, refresh current and refresh power may be reduced even though the refresh time is long.

For example, the semiconductor memory device 100 may divide the memory cell array 110 into desired (or, alternatively, predetermined) blocks according to a distribution of fail cells of the memory cells in the memory cell array 110 based on a retention time that is longer than a refresh cycle tREF defined by the specification of a volatile memory device. Fail cells of a selected block may be repaired by using ECC cells and fail cells of non-selected blocks may be repaired by using redundancy cells. A refresh operation is performed on the memory cells of the memory cell array 110 at a cycle that is longer than the refresh cycle tREF defined by the specification so that refresh current and refresh power may be reduced.

In a process of testing the semiconductor memory device 100, data retention characteristics of the memory cells of the memory cell array 110 may be tested. During the testing process as part of a manufacturing process, distributions of fail cells of the memory cells based on the data retention characteristics may be accumulated.

Figure 2:
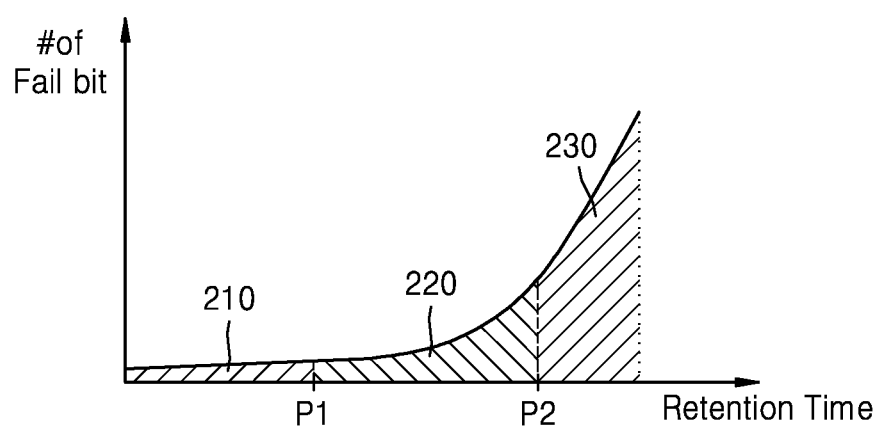
FIG. 2 is a graph of a result of testing data retention characteristics of memory cells of a memory cell array of FIG. 1.

FIG. 2 illustrates a graph of a result of testing data retention characteristics of memory cells of a memory cell array of FIG. 1.

Referring to FIG. 2, the distribution of fail cells based on the retention time of memory cells may be obtained from the testing.

Memory cells having a minimum retention time that is less than or equal to a first cycle P1 may be classified as first fail cells 210. The first cycle P1 may be the refresh cycle tREF defined by the specification of the volatile memory device.

Thereafter, the first cycle P1 may be set to be longer than the refresh cycle tREF and the first fail cells 210 may be substituted by redundancy cells. For example, the first cycle P1 may be set to be two times greater than the refresh cycle tREF.

Memory cells having a minimum retention time that is shorter than or equal to a second cycle P2 may be classified as second fail cells 220. The second cycle P2 may be set to be longer than the first cycle P1. For example, the second cycle P2 may be set to be three times greater than the refresh cycle tREF. The second fail cells 220 may be repaired by using ECC cells.

Since most of the memory cells 230 have a minimum retention time that is longer than the second cycle P2, these memory cells 230 have an excellent data retention characteristic. Even when the refresh operation is performed on the memory cells 230 at the second cycle, the memory cells 230 may stably retain data.

Referring back to FIG. 1, the memory cell array 110 may be divided into first and second blocks 110A and 110B based on the distribution of fail cells of the memory cells. The first fail cells 210 and the second fail cells 220 illustrated as crosses and circles in FIG. 1, as shown in the legend included therewith, may be randomly distributed in the first and second blocks 110A and 110B. Alternatively, in other example embodiments, the memory cell array 110 may be divided into more than two blocks, for example, the memory cell array 110 may be divided into four blocks based on the distribution of fail cells of the memory cells.

The semiconductor memory device 100 may substitute the first and second fail cells 210 and 220 in the first block 110A with redundancy cells of the memory cell array 110. For example, the semiconductor memory device may utilize a redundancy cell array 130 included in the memory cell array 110 to repair the first and second fail cells 210 and 220.

As illustrated in FIG. 1, the redundancy cell array 130 may be arranged proximate to a normal cell array of the memory cell array 110 and at an edge of the memory cell array 110. The first block 110A and the second block 110B may form the normal cell array. Further, while not illustrated, in other example embodiments, the redundancy cell array 130 may be arranged between the first block 110A and the second block 110B in the middle of the memory cell array 110.

Each of the first and second blocks 110A and 110B of the memory cell array 110 may write data to and/or read data from memory cells in units. For example, 64 data bits Data[0:63] of one unit group may be written to/read from the first and second blocks 110A and 110B. However, example embodiments are not limited thereto, for example, the data bits in one unit group may be 8, 16, 32, or 128 bits.

The semiconductor memory device 100 may repair an error bit included in the 64 data bits Data[0:63] written to/read from the first block 110A using the redundancy cell array 130.

The semiconductor memory device 100 may repair an error bit included in 64 data bits Data[0:63] written to/read from the second block 110B using the ECC cell array 120. For example, the first and second fail cells 210 and 220 in the second block 110B of the memory cell array 110 may be repaired by using the ECC cell array 120. The second block 110B is a block set to perform an ECC function. The ECC cell array 120 includes a plurality of memory cells arranged in columns and rows, similarly with the memory cell array 110. The ECC cell array 120 may store parity bits ECCP with respect to the first and second fail cells 210 and 220 of the second block 110B.

The ECC controller 400 may determine whether an access address ADDR applied from the outside of the semiconductor memory device 100 is an address associated with the second block 110B which is set to perform the ECC function. The ECC controller 400 may store information with respect to the second block 110B and compare the stored block information and the access address ADDR to generate an ECC control signal ECC_CON. The ECC controller 400 may provide the ECC control signal ECC_CON to the ECC engine 600 so that the ECC engine 600 performs the ECC function. The ECC engine 600 may perform the ECC function with respect to all memory cells in the second block 110B based on the ECC control signal ECC_CON.

According to some example embodiments, the ECC controller 400 may determine whether the access address ADDR is associated with an address related to fail cells. For example, the ECC controller 400 may store information with respect to the second block 110B, for example, the address of the first and second fail cells 210 and 220 in the second block 110B. The ECC controller 400 may compare the address of the stored first and second fail cells and the access address ADDR to generate the ECC control signal ECC_CON. By way of the ECC control signal ECC_CON, the ECC controller 400 may instruct the ECC engine 600 to perform the ECC function with respect to the first and second fail cells 210 and 220 in the second block 110B.

The ECC engine 600 may perform the ECC function on the second block 110B in response to the ECC control signal ECC_CON. The ECC engine 600 may perform the ECC function, by generating the parity bits ECCP with respect to data bits written to the memory cells of the second block 110B, in response to the ECC control signal ECC_CON, and by detecting and correcting error bits included in the data bits by using the parity bits ECCP.

The ECC engine 600 may generate the parity bits ECCP such that the parity bits ECCP are 8 bits with respect to 64 data bits written to the second block 110B, and the ECC engine 600 may detect and correct the error bit included in 64 data bits by using 64 data bits read from the second block 110B and the 8 parity bits ECCP read from the ECC cell array 120.

For example, the ECC engine 600 may perform the ECC function on fail cells of the second block 110B in response to the ECC control signal ECC_CON. The ECC engine 600 may generate the parity bits ECCP such that the parity bits ECCP are 8 bits with respect to 64 data bits written to the memory cells including the fail cells of the second block 110B, and the ECC engine 600 may detect and correct the error bit included in 64 data bits by using 64 data bits read from the memory cells including the fail cells of the second block 110B and the 8 parity bits ECCP read from the ECC cell array 120.

The semiconductor memory device may include a processor, that when executing computer readable code stored in a memory, configures the processor as the ECC controller 400 and the ECC engine 600. The processor may be any device capable of processing data including, for example, a microprocessor configured to carry out specific operations by performing arithmetical, logical, and input/output operations based on input data, or capable of executing instructions included in computer readable code. The processor may be a logic chip, for example, a central processing unit (CPU), a controller, or an application-specific integrated circuit (ASIC), that when, executing the instructions stored in the memory, configures the processor as a special purpose machine to perform the operations illustrated in FIG. 3. The operations performed by the processor may improve the functioning of the semiconductor memory device itself by, for example, allowing the semiconductor memory device to designing the refresh time based on the retention time of cells in the memory array 110 having better data retention characteristics.

Figure 3:
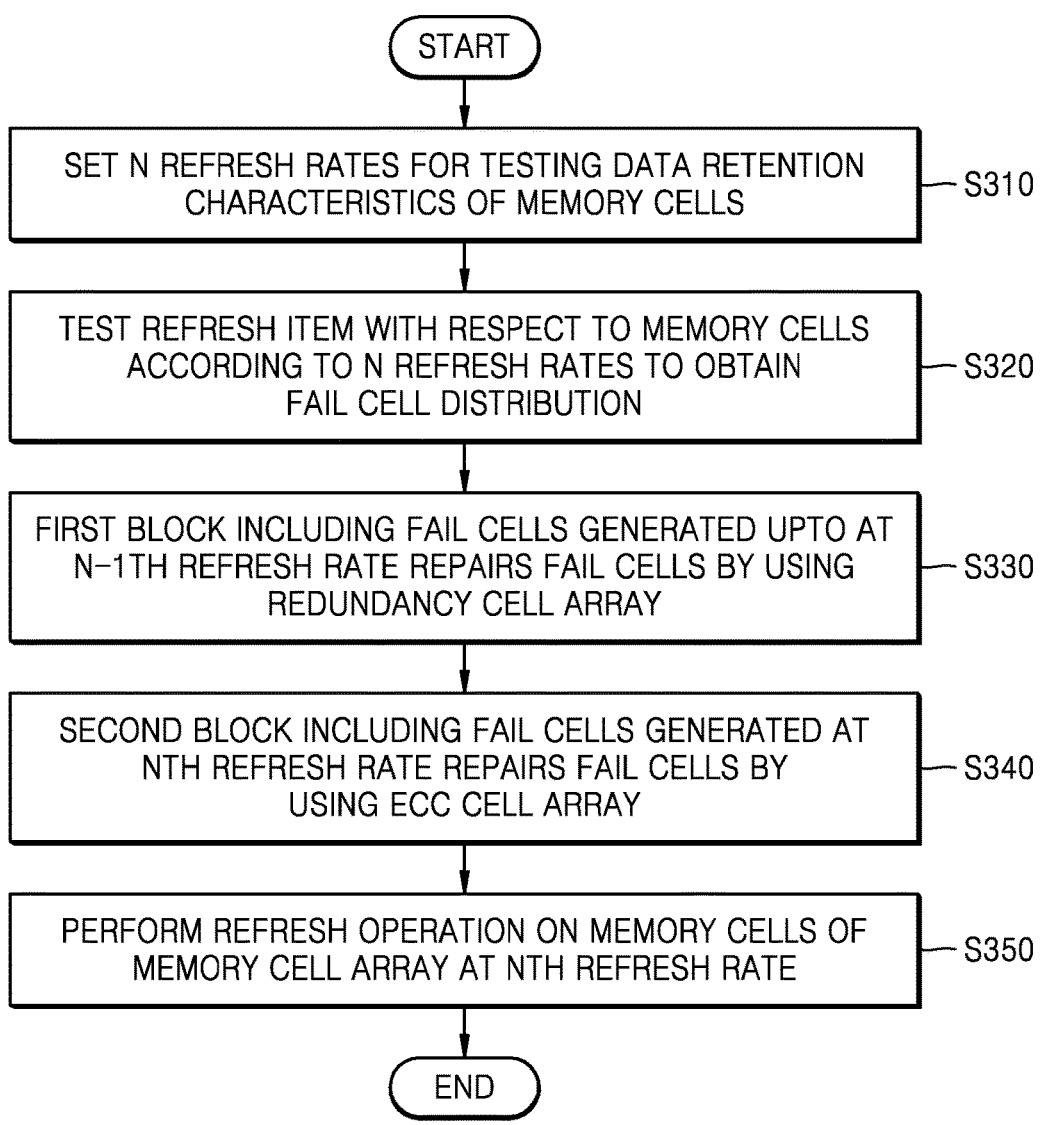
FIG. 3 is a flowchart of a method of operating a semiconductor memory device, according to some example embodiments.

FIG. 3 is a flowchart of a method of operating the semiconductor memory device 100, according to some example embodiments.

Referring to FIGS. 1 and 3, in a process of testing the semiconductor memory device 100, data retention characteristics of the memory cells of the memory cell array 110 may be tested.

In operation S310, to test the data retention characteristics of the memory cells of the memory cell array 110, the semiconductor memory device 100 may set n refresh rates, where n is a natural number that is greater than or equal to 2. The n refresh rates may include the refresh cycle tREF defined by the standards and the refresh cycles P1 and P2 that are longer than the refresh cycle tREF. For example, a first one of the n refresh rates may be the refresh cycle tREF, a second one of the n refresh rates may be the first cycle P1 that is two times greater than the refresh cycle tREF, and a third one of the n refresh rates may be the second cycle P2 that is three times greater than the refresh cycle tREF. The n refresh rates may include 3 refresh rates, where the first cycle P1 is the n−1th refresh rates, and the second cycle P2 is the nth refresh rates.

In operation S320, the semiconductor memory device 100 may test a refresh item of memory cells of the memory cell array 110 according to the n refresh rates to obtain a distribution of fail cells of the memory cell array 110. In the memory cell array 110, a distribution of the fail cells generated up to the n−1th refresh rate may be obtained. For example, a distribution of the fail cells generated up to the first cycle P1 may be obtained. Also, a distribution of fail cells generated based on the nth refresh rate may be obtained. For example, a distribution of the fail cells generated based on the second cycle P2 may be obtained.

In operation S330, the fail cells in the first block 110B generated up to the n−1th refresh rate may be repaired using the redundancy cell array 130. Therefore, since the fail cells generated up to the n−1th refresh rate are memory cells having a poor data retention characteristics, the fail cells generated up to the n−1th refresh rate may not be substituted by redundancy cells.

In operation S340, the fail cells in the second block 110B generated based on the nth refresh rate may be repaired using the ECC cell array 120. For example, the fail cells generated at the nth refresh rate may be repaired using the parity bits stored in the ECC cell.

As described above, the fail cells generated in the first block 110A based on the n−1th refresh rate may be repaired via substitution using the redundancy cell array 130, and the fail cells in the second block 110B generated based on the nth refresh rate may be repaired via error correction using the ECC cell array 120.

In operation S350, since the fail cells generated up to the nth refresh rate are repaired, the refresh operation may be performed on the memory cells of the memory cell array 110 at the nth refresh rate. For example, the second cycle P2 may be used as the refresh rate. Even if the refresh operation is performed on the memory cells of the memory cell array 110 at the nth refresh rate (the second cycle P2), the memory cells of the memory cell array 110 may retain data. Accordingly, the refresh operation is performed on the memory cells of the memory cell array 110 at the cycle P2 that is longer than the refresh cycle tREF defined by the standards so that refresh current and refresh power may be reduced.

Since the fail cells in the first block 110A of the memory cell array 110 are repaired by substituting the fail cells with cells from the redundancy cell array 130, the first block 110A of the memory cell array 110 does not require the ECC cell array 120. Thus, the fail cells may be repaired without an increase in a size of chips of the semiconductor memory device 100. For example, if the ECC function is performed on 64 data bits of the first block 110A, a chip size overhead corresponding to 10% of a size of the first block 110A may be caused.

Figure 4:
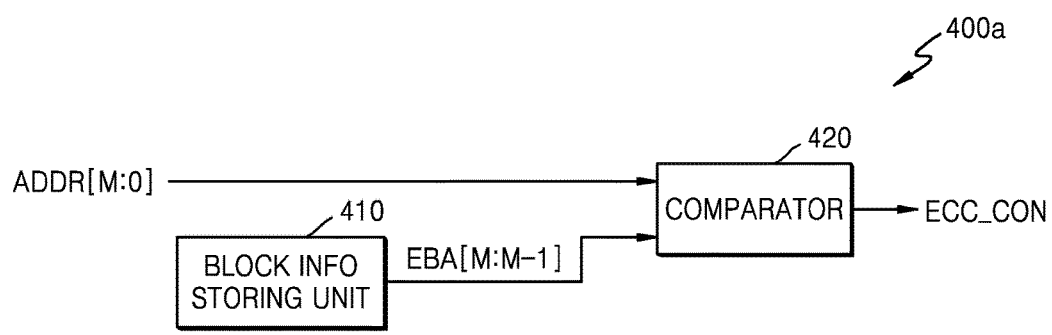
FIG. 4 is a diagram of a first example of an ECC controller of FIG. 1.

FIG. 4 is a diagram of an ECC controller 400a as a first example of the ECC controller 400 of FIG. 1.

Referring to FIGS. 1 and 4, the ECC controller 400a includes a block information storing unit 410 for storing information of a block set to perform the ECC function, and a comparator 420 for comparing the block information stored in the block information storing unit 410 and the access address ADDR.

The block information storing unit 410 may store a block address EBA[M:M−1] which addresses the second block 110B set to perform the ECC function. The memory cell array 110 is divided into two blocks, that is, the first block 110A and the second block 110B, according to a distribution of fail cells based on the data retention characteristics of the memory cells. When the access address ADDR[M:0] is formed of M+1 bits, the memory cell array 110 may be divided into the two blocks, namely, the first and second blocks 110A and 110B, by a most significant access address bit ADDR[M]. The block information storing unit 410 may store a block address EBA[M] corresponding to the most significant access address bit ADDR[M].

According to other example embodiments, the memory cell array 110 may be divided into four blocks by 2 significant bits ADDR[M:M−1] of the access address ADDR[M:0]. Therefore, the block information storing unit 410 may store the block address EBA[M:M−1] corresponding to the 2 significant bits ADDR[M:M−1] of the access address ADDR[M:0].

According to some embodiments, the block information storing unit 410 may be a one-time programmable memory, such as a laser-programmable fuse array, an anti-fuse array, or an electric programmable fuse array, or may be a nonvolatile memory device, such as magnetic random access memory (MRAM), resistance random access memory (RRAM), phase change random access memory (PRAM), or a flash memory.

The comparator 420 may receive the access address ADDR and receive the block address EBA[M:M−1] set to perform the ECC function from the block information storing unit 410. The comparator 420 may output the ECC control signal ECC_CON when the 1 or 2 significant bits of the access address ADDR[M:0] correspond to the block address EBA[M:M−1] which addresses the second block 110B set to perform the ECC function. The ECC control signal ECC_CON may be provided to the ECC engine 600 so that the ECC function is performed on all memory cells in the second block 110B set to perform the ECC function.

Figure 5:
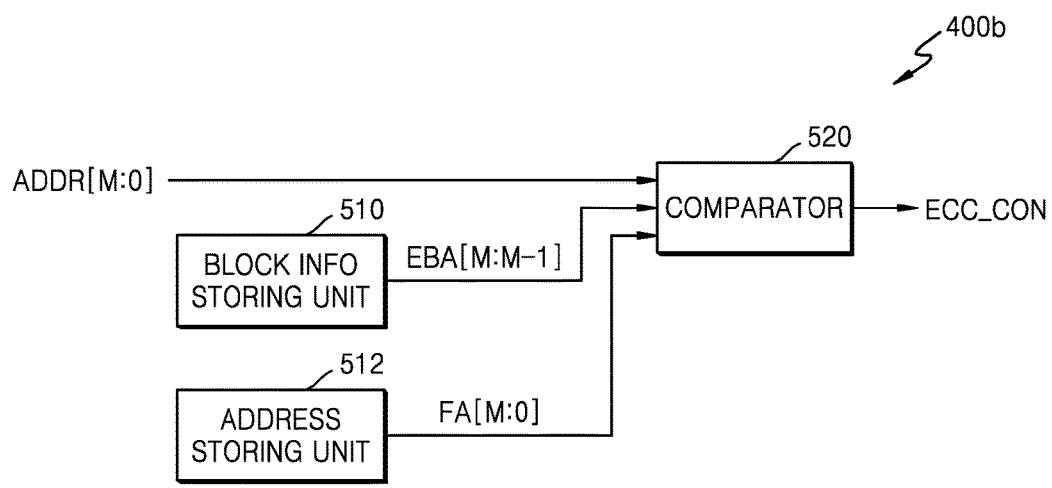
FIG. 5 is a diagram of a second example of the ECC controller of FIG. 1.

FIG. 5 is a view of a second example of the ECC controller 400b of FIG. 1.

Referring to FIG. 5, the ECC controller 400b includes a block information storing unit 510, an address storing unit 512, and a comparator 520. The block information storing unit 510 may store information of a block EBA[M:M−1] set to perform the ECC function. The address storing unit 512 may store an address FA[M:0] of fail cells in the block set to perform the ECC function. The block information storing unit 510 and the address storing unit 512 may be a one-time programmable memory, such as a laser-programmable fuse array, an anti-fuse array, or an electric programmable fuse array, or may be a nonvolatile memory device, such as MRAM, RRAM, PRAM, or a flash memory.

The comparator 520 may compare the block information EBA[M:M−1] stored in the block information storing unit 510 and the fail cell address FA[M:0] stored in the address storing unit 512 with the access address ADDR[M:0] to generate the ECC control signal ECC_CON. The ECC control signal ECC_CON may be provided to the ECC engine 600 so that the ECC function is performed on the fail cells in the second block 110B of the memory cell array 110.

Figure 6:
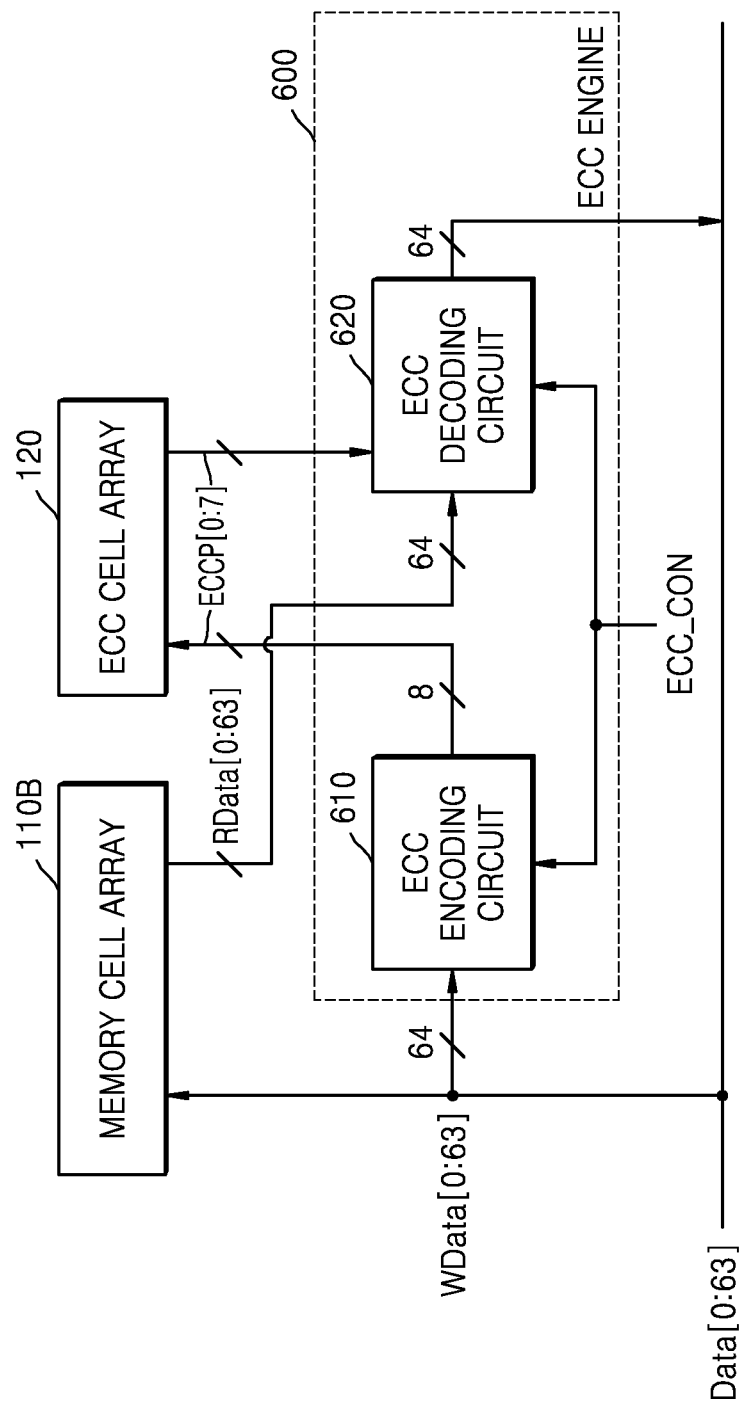
FIG. 6 is a block diagram of an ECC engine of FIG. 1.

FIG. 6 is a block diagram of the ECC engine 600 of FIG. 1.

Referring to FIG. 6, the ECC engine 600 may include an ECC encoding circuit 610 and an ECC decoding circuit 620.

The ECC encoding circuit 610 may generate parity bits ECCP[0:7] with respect to write data WData[0:63] to be written to the memory cells of the second block 110B of the memory cell array 110, in response to the ECC control signal ECC_CON. The parity bits ECCP[0:7] may be stored in the ECC cell array 120. According to some example embodiments, the ECC encoding circuit 610 may generate parity bits ECCP[0:7] with respect to write data WData[0:63] to be written to the memory cells including a fail cell of the second block 110B, in response to the ECC control signal ECC_CON.

In response to the ECC control signal ECC_CON, the ECC decoding circuit 620 may correct error bit data by using read data RData[0:63] read from the memory cells of the second block 110B of the memory cell array and the parity bits ECCP[0:7] read from the ECC cell array 120, and output data Data[0:63] with the corrected error bit. According to some example embodiments, in response to the ECC control signal ECC_CON, the ECC decoding circuit 620 may correct error bit data by using read data RData[0:63] read from the memory cells including the fail cell of the second block 110B and the parity bits ECCP[0:7] read from the ECC cell array 120, and output data Data[0:63] with the corrected error bit.

Figure 7:
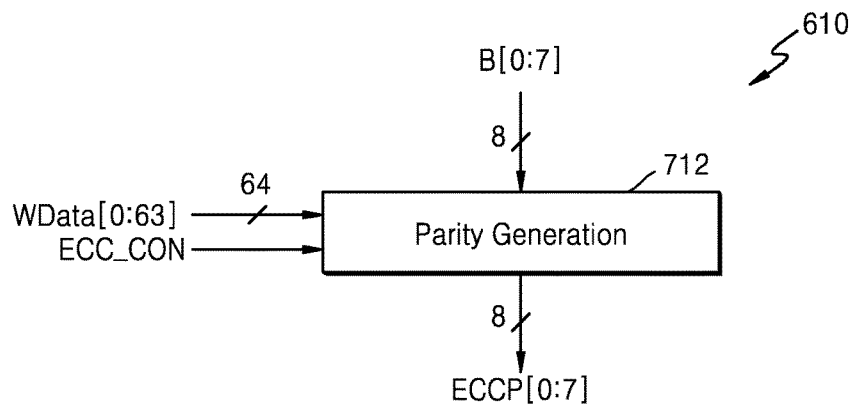
FIG. 7 is a diagram of an ECC encoding circuit of FIG. 6.

FIG. 7 is a view of the ECC encoding circuit 610 of FIG. 6.

Referring to FIG. 7, the ECC encoding circuit 610 may include a parity generator 712 that receives the write data WData[0:63] in 64 bits and a basis bit B[0:7] in response to the ECC control signal ECC_CON, and generates the parity bits ECCP[0:7] by using an XOR array operation. The basis bit B[0:7] is for generating the parity bits ECCP[0:7] with respect to the write data WData[0:63] in 64 bits. For example, the basis bit B[0:7] may be b'00000000. The basis bit B[0:7] may use other specific bits instead of the b'00000000.

Figure 8:
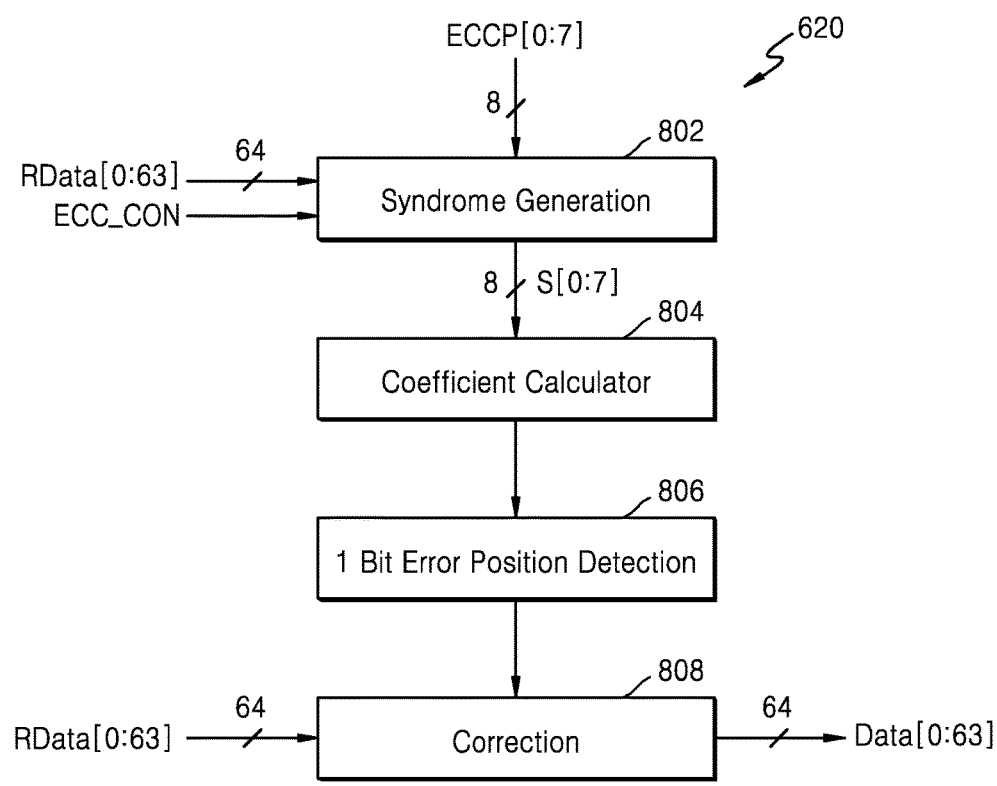
FIG. 8 is a diagram of an ECC decoding circuit of FIG. 6.

FIG. 8 is a view of the ECC decoding circuit 620 of FIG. 6.

Referring to FIG. 8, the ECC decoding circuit 620 may include a syndrome generator 802, a coefficient calculator 804, a 1-bit error position detector 806, and an error corrector 808. The syndrome generator 802 may receive read data RData[0:63] in 64 bits and the parity bits ECCP[0:7] in 8 bits in response to the ECC control signal ECC_CON, and generate syndrome data S[0:7] by using an XOR array operation. The coefficient calculator 804 may calculate a coefficient of an error position equation by using the syndrome data S[0:7]. The error position equation is an equation that uses a reciprocal of an error bit as a root. The 1-bit error position detector 806 may calculate a position of a 1-bit error by using the calculated error position equation. The error corrector 808 may determine the position of the 1-bit error, based on the calculation result of the 1-bit error position detector 806. The error corrector 808 may correct an error by reversing a logic value of a bit having an error from among the read data RData[0:63] in 64 bits according to the determined position of the 1-bit error and output the data Data[0:63] in which the error is corrected.

Figure 9:
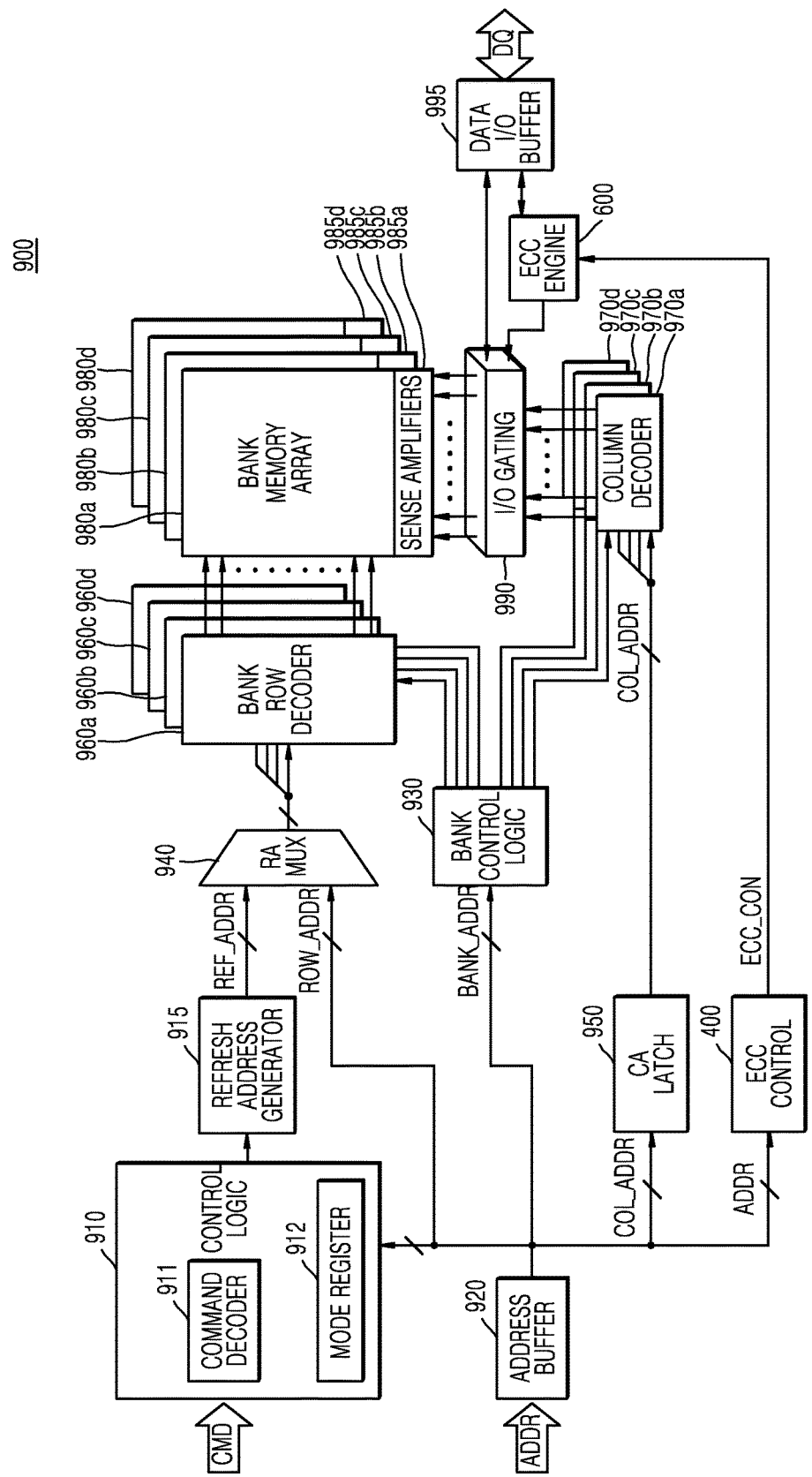
FIG. 9 is a diagram of a semiconductor memory device capable of performing a selective ECC function, according to other example embodiments.

FIG. 9 is a diagram of a semiconductor memory device 900 capable of performing a selective ECC function, according to other example embodiments.

Referring to FIG. 9, the semiconductor memory device 900 may include a control logic 910, a refresh address generator 915, an address buffer 920, a bank control logic 930, a row address (RA) multiplexer 940, a column address (CA) latch 950, a row decoder 960, a column decoder 970, a memory cell array 980, a sense amplifier 985, an input/output (I/O) gating circuit 990, a data I/O buffer 995, the ECC controller 400, and the ECC engine 600.

As illustrated in FIG. 9, the semiconductor memory device 900 may include four memory banks. Therefore, the memory cell array 900 may include first through fourth bank arrays 980a, 980b, 980c, and 980d. The row decoder 960 may include first through fourth bank row decoders 960a through 960d respectively connected to the first through fourth bank arrays 980a through 980d. The column decoder 970 may include first through fourth bank column decoders 970a through 970d respectively connected to the first through fourth bank arrays 980a through 980d. The sense amplifier 985 may include first through fourth bank sense amplifiers 985a through 985d respectively connected to the first through fourth bank arrays 980a through 980d. The first through fourth bank arrays 980a through 980d, the first through fourth bank row decoders 960a through 960d, the first through fourth bank column decoders 970a through 970d, and the first through fourth bank sense amplifiers 985a through 985d may form first through fourth memory banks, respectively. In FIG. 9, the semiconductor memory device 900 includes four memory banks; however, example embodiments are not limited thereto, for example, the semiconductor memory device 900 may include more or less than four memory banks.

Also, according to some example embodiments, the semiconductor memory device 900 may be DRAM, such as double data rate synchronous DRAM (DDR SDRAM), low power double data rate (LPDDR) SDRAM, graphic double data rate (GDDR) SDRAM, or Rambus DRAM (RDRAM), or an arbitrary volatile memory device that requires a refresh operation.

The control logic 910 may control operations of the semiconductor memory device 900. For example, the control logic 910 may generate control signals such that the semiconductor memory device 900 performs a write operation or a read operation. The control logic 910 may include a command decoder 911 that decodes a command CMD received from a memory controller, and a mode register 912 that sets an operation mode of the semiconductor memory device 900. For example, the command decoder 911 may generate control signals corresponding to the command CMD by decoding a write enable signal/WE, a row address strobe signal/RAS, a column address strobe signal/CAS, or a chip select signal/CS.

The control logic 910 may further receive clock signals CLK and a clock enable signal CKE for driving the semiconductor memory device 900 in a synchronization manner. The control logic 910 may control the refresh address generator 915 to perform an auto-refresh operation in response to a refresh command, or to perform a self-refresh operation in response to a self-refresh enter command.

The refresh address generator 915 may generate a refresh address REF_ADDR corresponding to a memory cell row on which a refresh operation is to be performed. The refresh address generator 915 may generate the refresh address REF_ADDR at a refresh rate of a refresh cycle that is longer than a refresh cycle defined by the standards of the semiconductor memory device 900. Accordingly, refresh current and refresh power of the semiconductor memory device 900 may be reduced.

The address buffer 920 may receive an address ADDR including a bank address BANK_ADDR, a row address ROW_ADDR, and a column address COL_ADDR from the memory controller. Also, the address buffer 920 may provide the received bank address BANK_ADDR to the bank control logic 930, provide the received row address ROW_ADDR to the row address multiplexer 940, and provide the received column address COL_ADDR to the column address latch 950.

The bank control logic 930 may generate bank control signals in response to the bank address BANK_ADDR. In response to the bank control signals, a bank row decoder corresponding to the bank address BANK_ADDR from among the first through fourth bank row decoders 960a through 960d may be activated, and a bank column decoder corresponding to the bank address BANK_ADDR from among the first through fourth bank column decoders 970a through 970d may be activated.

The bank control logic 930 may generate bank group control signals in response to the bank address BANK_ADDR for determining a bank group. In response to the bank group control signals, row decoders of a bank group corresponding to the bank address BANK_ADDR from among the first through fourth bank row decoders 960a through 960d may be activated, and column decoders of a bank group corresponding to the bank address BANK_ADDR from among the first through fourth bank column decoders 970a through 970d may be activated.

The row address multiplexer 940 may receive the row address ROW_ADDR from the address buffer 920 and the refresh address REF_ADDR from the refresh address generator 915. The row address multiplexer 940 may selectively output the row address ROW_ADDR or the refresh address REF_ADDR. The row address ROW_ADDR output from the row address multiplexer 940 may be applied to each of the first through fourth bank row decoders 960a through 960d.

The bank row decoder activated by the bank control logic 930 from among the first through fourth bank row decoders 960a through 960d may decode the row address ROW_ADDR output by the row address multiplexer 940 and activate a word line corresponding to the row address ROW_ADDR. For example, the activated bank row decoder may apply a word line driving voltage to the word line corresponding to the row address ROW_ADDR.

The column address latch 950 may receive the column address COL_ADDR from the address buffer 920 and temporarily store the received column address COL_ADDR. The column address latch 950 may gradually increase the column address COL_ADDR in a burst mode. The column address latch 950 may apply the column address COL_ADDR that is temporarily stored or gradually increased to each of the first through fourth bank column decoders 970a through 970d.

The bank column decoder activated by the bank control logic 930 from among the first through fourth bank column decoders 970a through 970d may activate a sense amplifier corresponding to the bank address BANK_ADDR and the column address COL_ADDR through the I/O gating circuit 990.

The I/O gating circuit 990 may include, together with circuits for gating I/O data, an input data mask logic, read data latches for storing data output from the first through fourth bank arrays 980a through 980d, and write drivers for writing data to the first through fourth bank arrays 980a through 980d.

Data to be read from one of the first through fourth bank arrays 980a, 980b, 980c, and 980d may be detected and amplified by a sense amplifier and may be stored in read data latches. Data DQ stored in the read data latch may be provided to a memory controller through the data I/O buffer 995. The data DQ to be written to the one of the first through fourth bank arrays 980a, 980b, 980c, and 980d may be provided to the data I/O buffer 995 from the memory controller. The data DQ provided to the data I/O buffer 995 may be written to the one bank array through a write driver.

Each of the first through fourth bank arrays 980a, 980b, 980c, and 980d may include a normal cell array, a redundancy cell array, and an ECC cell array including a plurality of memory cells arranged in columns and rows. The normal cell array of the first through fourth bank arrays 980a, 980b, 980c, and 980d may be divided into a plurality of blocks based on a distribution of fail cells based on data retention characteristics of the memory cells.

A block in which there are a plurality of fail cells at a refresh rate that is longer than the refresh cycle tREF defined by the standards, from among the divided blocks, may be selected as a second block in which an error correction function is applied to repair the fail cells therein. For example, the fail cells in the selected second block may be repaired using the ECC cell array. The other blocks, may be first blocks in which fail cells therein are repaired using an associated one of the redundancy cell arrays.

The ECC controller 400 may determine whether the address ADDR output from the address buffer 920 addresses the second block. The ECC controller 400 may store information regarding the second block and/or an address of fail cells in the second block and may compare the block information and/or the address of the fail cells with the address ADDR to generate the ECC control signal ECC_CON. According to some example embodiments, when the information regarding the second block is related to a row address ROW_ADDR, the ECC controller 400 may be included in the first through fourth bank row decoders 960a, 960b, 960c, and 960d. According to other example embodiments, when the information regarding the second block is related to a column address COL_ADDR, the ECC controller 400 may be included in the first through fourth bank column decoders 970a, 970b, 970c, and 970d.

The ECC engine 600 may perform the ECC function on the second block in response to the ECC control signal ECC_CON. According to some example embodiments, the ECC engine 600 may perform the ECC function on fail cells of the second block in response to the ECC control signal ECC_CON.

Figure 10:
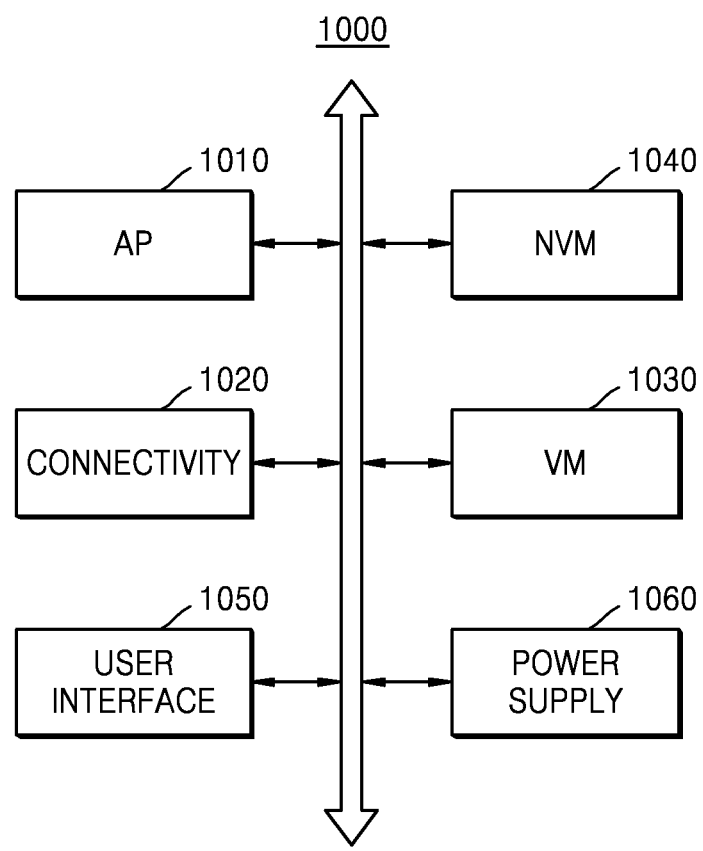
FIG. 10 is a block diagram of a mobile system to which a semiconductor memory device having a selective ECC function is applied, according to some example embodiments.

FIG. 10 is a block diagram of a mobile system 1000 to which a semiconductor memory device having a selective ECC function is applied, according to some example embodiments.

Referring to FIG. 10, the mobile system 1000 may include an application processor 1010, a connectivity unit 1020, a first memory device 1030, a second memory device 1040, a user interface 1050, and a power supply source 1060, which are connected to each other via a bus 1002. The first memory device 1030 may be a volatile memory (VM) device, and the second memory device 1040 may be a nonvolatile memory (NVM) device. According to some example embodiments, the mobile system 1000 may be a mobile phone, a smart phone, a personal digital assistant (PDA), a portable multimedia player (PMP), a digital camera, a music player, a portable game console, or a navigation system.

The application processor 1010 may execute applications, for example, applications that provide an Internet browser, a game, and/or a video. According to some example embodiments, the application processor 1010 may include a single core or a multi-core processor. For example, the application processor 1010 may include a dual-core, a quad-core, or a hexa-core processor. Also, according to some example embodiments, the application processor 1010 may further include an internal or external cache memory.

The connectivity unit 1020 may perform wireless communication and/or wired communication with an external apparatus. For example, the connectivity unit 1020 may perform Ethernet communication, near field communication (NFC), radio frequency identification (RFID) communication, mobile telecommunication, memory card communication, or universal serial bus (USB) communication. For example, the connectivity unit 1020 may include a baseband chipset and may support communication, such as global system for mobile communication (GSM), gross rating points (GRPS), wideband code division multiple access (WCDMA), or high speed packet access (HSxPA).

The first memory device 1030, that is the volatile memory device, may store data processed by the application processor 1010 or may operate as a working memory.

The first memory device 1030 divides a memory cell array into desired (or, alternatively, predetermined) blocks according to data retention characteristics of memory cells. The first memory device 1030 selects a block in which there are a plurality of fail cells generated at a refresh rate of a refresh cycle that is longer than a refresh cycle defined by the standards, as a second block from among the divided desired (or, alternatively, predetermined) blocks. The first memory device 130 performs the ECC function on the selected second block to repair the fail cells therein, and the first memory device 130 repairs fails cells in the blocks that are not selected using redundancy cells, thereby performing a refresh operation on the memory cells of the memory cell array at the refresh rate of the refresh cycle that is longer than the refresh cycle defined by the standards. Therefore, refresh current and refresh power may be reduced.

The second memory device 1040, that is the nonvolatile memory device, may store a boot image for booting the mobile system 1000. For example, the second memory device 1040 may be electrically erasable programmable read-only memory (EEPROM), a flash memory, PRAM, resistance random access memory (RRAM), nano-floating gate memory (NFGM), polymer random access memory (PoRAM), magnetic random access memory (MRAM), ferroelectric random access memory (FRAM), or a memory similar thereto.

In an embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present inventive concept, the 3D memory array includes vertical NAND strings that are vertically oriented such that at least one memory cell is located over another memory cell. The at least one memory cell may comprise a charge trap layer.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648. The user interface 1050 may include at least one input device, such as a keypad or a touch screen, and/or at least one output device, such as a speaker or a display device. The power supply source 1060 may supply an operation voltage. Also, according to some embodiments, the mobile system 1000 may further include a camera image processor (CIP), and may further include a storage device, such as a memory card, a solid state drive (SSD), a hard disk drive (HDD), or a CD-ROM.

Figure 11:
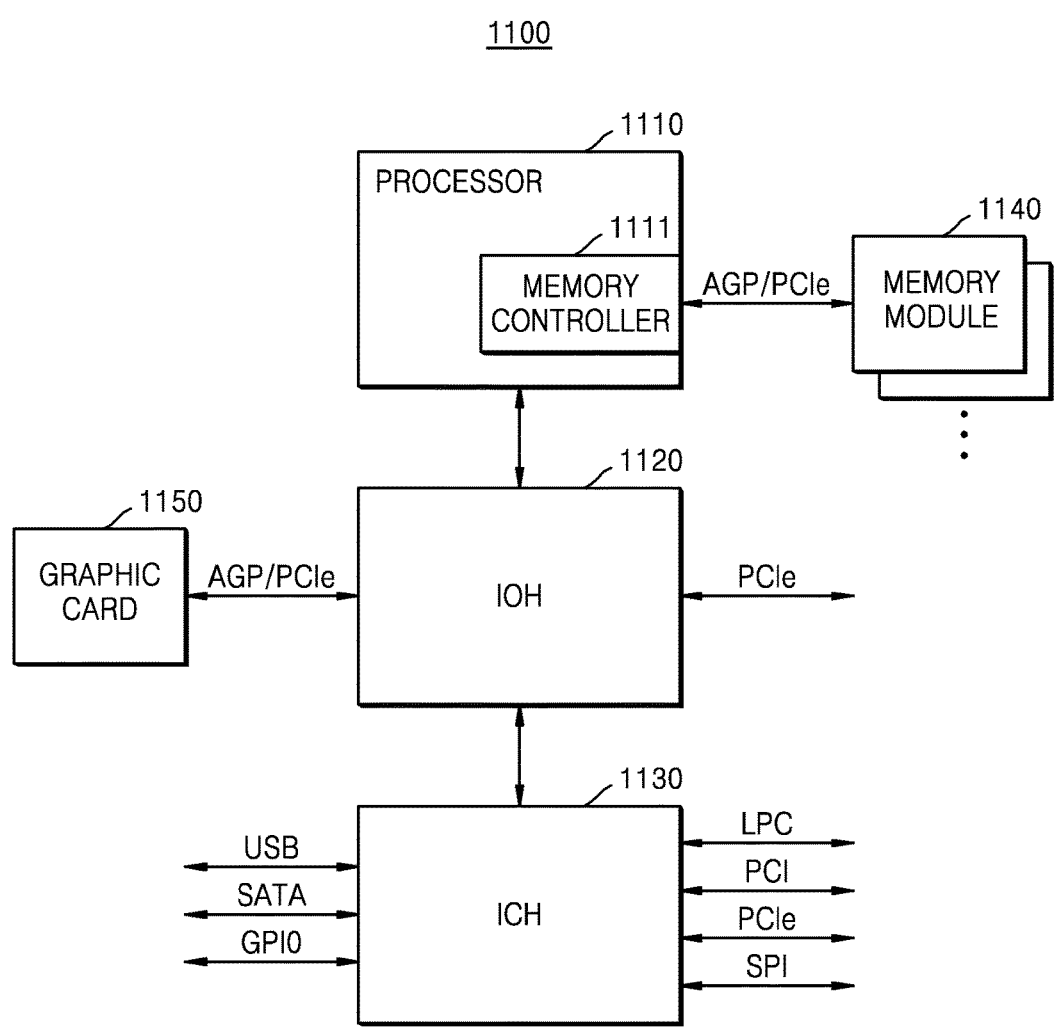
FIG. 11 is a block diagram of a computing system to which a semiconductor memory device having a selective ECC function is applied, according to some example embodiments.

FIG. 11 is a block diagram of a computing system 1100 to which a semiconductor memory device having a selective ECC function is applied, according to some example embodiments.

Referring to FIG. 11, the computing system 1100 includes a processor 1110, an I/O hub (IOH) 1120, an I/O controller hub (ICH) 1130, a memory module 1140, and a graphics card 1150. According to some example embodiments, the computing system 1100 may be a personal computer (PC), a server computer, a workstation, a laptop, a mobile phone, a smart phone, a PDA, a PMP, a digital camera, a digital television (DTV), a set-top box, a music player, a portable game console, or a navigation system.

The processor 1110 may execute various computing functions, such as certain calculations or tasks. For example, the processor 1110 may be a microprocessor or a CPU. According to some embodiments, the processor 1110 may include a single core or a multi-core processor. For example, the processor 1110 may include a dual-core, a quad-core, or a hexa-core processor. Also, in FIG. 11, the computing system 1100 includes one processor 1110; however, according to embodiments, the computing system 1100 may include a plurality of processors 1110. Also, according to some embodiments, the processor 1110 may further include an internal or external cache memory.

The processor 1110 may include a memory controller 1111 that controls operations of the memory module 1140. The memory controller 1111 included in the processor 1110 may be referred to as an integrated memory controller (IMC). A memory interface between the memory controller 1111 and the memory module 1140 may be one channel including a plurality of signal lines or a plurality of channels. Also, at least one memory module 1140 may be connected to each channel. According to some example embodiments, the memory controller 1111 may be disposed inside the IOH 1120. The IOH 1120, including the memory controller 1111, may be referred to as a memory controller hub (MCH).

The memory module 1140 may include a plurality of memory chips storing data provided from the memory controller 1111. The plurality of memory chips may be DRAM, such as DDR SDRAM, LPDDR SDRAM, GDDR SDRAM, and RDRAM.

The memory chips included in the memory module 1140 each divide a memory cell array into desired (or, alternatively, predetermined) blocks according to data retention characteristics of memory cells therein.

For example, the memory chips select a block in which there are a plurality of fail cells generated at a refresh rate of a refresh cycle that is longer than the refresh cycle defined by the standards, as a second block from among the divided blocks. The memory chip repairs fails cells in the selected second block by performing the ECC function, and repairs fail cells in the blocks that are not selected as the second block using redundancy cells, thereby performing a refresh operation on the memory cells of the memory cell array at the refresh rate of the refresh cycle that is longer than the refresh cycle defined by the standards. Therefore, refresh current and refresh power may be reduced.

The IOH 1120 may manage data transmission between apparatuses, such as the graphics card 1150, and the processor 1110. The IOH 1120 may be connected to the processor 1110 via any type of interface. For example, the IOH 1120 and the processor 1110 may be connected to each other via an interface according to any of various standards, such as a front side bus (FSB), a system bus, HyperTransport, lighting data transport (LDT), quick path interconnect (QPI), a common system interface, and peripheral component interface-express (PCIe). In FIG. 11, the computing system 1100 includes one IOH 1120; however, in other example embodiments, the computing system 1100 may include a plurality of IOHs 1120.

The IOH 1120 may provide various interfaces with apparatuses. For example, the IOH 1120 may provide an accelerated graphics port (AGP) interface, a PCIe interface, or a communication streaming architecture (CSA) interface.

The graphics card 1150 may be connected to the IOH 1120 through AGP or PCIe. The graphics card 1150 may control a display device (not shown) for displaying an image. The graphics card 1150 may include an internal processor and an internal semiconductor memory device for processing image data. According to some embodiments, the IOH 1120 may include a graphics device therein together with or instead of the graphics card 1150 disposed outside the IOH 1120. The graphics device included in the IOH 1120 may be referred to as integrated graphics. Also, the IOH 1120, including a memory controller and a graphics device, may be referred to as a graphics and memory controller hub (GMCH).

The ICH 1130 may perform data buffering and interface arbitration such that various system interfaces efficiently operate. The ICH 1130 may be connected to the IOH 1120 through an internal bus. For example, the IOH 1120 and the ICH 1130 may be connected to each other via a direct media interface (DMI), a hub interface, an enterprise Southbridge interface (ESI), or PCIe.

The ICH 1130 may provide various interfaces with peripheral devices. For example, the ICH 1130 may provide a USB port, a serial advanced technology attachment (SATA), a general purpose I/O (GPIO), a low pin count (LPC) bus, a serial peripheral interface (SPI), PCI, or PCIe.

According to some example embodiments, at least two of the processor 1110, the IOH 1120, and the ICH 1130 may be incorporated into one chipset.

While example embodiments been particularly shown and described with reference to some example embodiments thereof, it will be understood that various changes in form and details may be made therein without departing from the spirit and scope of the following claims.

What is claimed is:

1. A semiconductor memory device comprising:
a memory cell array including a plurality of memory cells, the plurality of memory cells divided into blocks according to data retention characteristics of the plurality of memory cells such that the blocks include an ECC select block and replaceable blocks;
an error correction code (ECC) cell array configured to store parity bits;
an ECC controller configured to store information indicating which of the blocks is the ECC select block, and to generate an ECC control signal, the ECC select block being one of the blocks having fail cells that are repairable via an ECC;
an ECC engine configured to generate the parity bits in response to the ECC control signal such that the parity bits are generated with respect to the ECC select block; and
a controller configured to refresh the memory cells in the ECC select block and the replaceable blocks at a refresh rate such that the refresh rate is a same refresh rate for both the ECC select block and the replaceable blocks.

2. The semiconductor memory device of claim 1, wherein the semiconductor memory device is configured to select the ECC select block from among the blocks according to a distribution of the fail cells at the refresh rate of a refresh cycle that is longer than a standard refresh rate associated with the semiconductor memory device.

3. The semiconductor memory device of claim 2, further comprising:
a refresh address generator configured to generate a refresh address at the refresh rate, the refresh address being an address of a row of the memory cells to refresh.

4. The semiconductor memory device of claim 1, wherein the semiconductor memory device is configured to repair fail cells in the replaceable blocks by replacing the fail cells with redundancy cells of the memory cell array.

5. The semiconductor memory device of claim 1, wherein the ECC controller comprises:
a block storing unit configured to store the information indicating which of the blocks is the ECC select block; and
a comparator configured to compare the information stored in the block storing unit with an access address received from outside, and to generate the ECC control signal based on a result of the comparison.

6. The semiconductor memory device of claim 1, wherein the ECC controller comprises
a block storing unit configured to store the information indicating which of the blocks is the ECC select block;
an address storing unit configured to store an address of the fail cells of the ECC select block; and
a comparator configured to compare the information stored in the block storing unit and the address of the fail cells stored in the address storing unit with an access address received from outside, and to generate the ECC control signal based on a result of the comparison.

7. The semiconductor memory device of claim 1, wherein the ECC engine comprises:
an ECC encoding circuit configured to generate, in response to the ECC control signal, the parity bits based on write data, the write data being data written to the plurality of memory cells of the ECC select block, and
an ECC decoding circuit configured to correct error bit data based on data stored in the plurality of memory cells of the ECC select block and the parity bits stored in the ECC cell array, and to output corrected error bit data.

8. The semiconductor memory device of claim 1, wherein the ECC engine comprises:
an ECC encoding circuit configured to generate, in response to the ECC control signal, the parity bits based on write data, the write data being data written to the plurality of memory cells including the fail cells of the ECC select block, and
an ECC decoding circuit configured to correct error bit data based on data stored in at least the fail cells of the ECC select block and the parity bits stored in the ECC cell array, and output corrected error bit data.

9. A method of operating a semiconductor memory device, the method comprising:
testing data retention characteristics of memory cells of a memory cell array at n refresh rates, where n is a natural number that is 2 or greater;
dividing the memory cell array into blocks including at least a first block and a second block such that the first block has a higher number of first fail cells than second fail cells therein, and the second block has a higher number of the second fail cells than the first fail cells therein, the first fail cells being ones of the memory cells that fail at an n–1$^{th}$ refresh rate and the second fail cells being ones of the memory cells that fail at an n$^{th}$ refresh rate;
repairing the first fail cells of the first block using a redundancy cell associated therewith;
performing an error correction code (ECC) operation on the second block; and
performing a refresh operation on the memory cells of the memory cell array at the n$^{th}$ refresh rate such that the memory cells in both the first block and the second block are refreshed at the n$^{th}$ refresh rate.

10. The method of claim 9, wherein the nth refresh rate has a refresh cycle that is longer than a refresh cycle of the n–1$^{th}$ refresh rate and the n–1$^{th}$ refresh rate has a refresh cycle that is longer than a standard refresh cycle associated with the semiconductor memory device.

11. The method of claim 9, further comprising:
storing, in a block storing unit, information indicating which of the blocks is the second block;
comparing the information stored in the block storing unit with an access address received from outside;
outputting an ECC control signal based on a result of the comparison, the ECC control signal controlling the ECC operation.

12. The method of claim 11, further comprising:
generating parity bits in response to the ECC control signal such that the parity bits are generated with respect to the second block;
storing the parity bits in an ECC cell array;

correcting error bit data based on data stored in the memory cells of the second block and the parity bits stored in the ECC cell array in response to the ECC control signal; and outputting the corrected error bit data.

13. The method of claim 9, further comprising:

storing, in a block storing unit, block information indicating which of the blocks is the second block;

storing, in an address storing unit, an address of the second fail cells of the second block;

comparing the block information with an access address received from the outside; and outputting an ECC control signal indicating whether to perform the ECC function based on a result of the comparison.

14. The method of claim 13, further comprising:

generating parity bits in response to the ECC control signal such that the parity bits are generated with respect to the second fail cells of the second block;

storing the parity bits in an ECC cell array;

correcting error bit data based on data stored in the second fail cells of the second block and the parity bits stored in the ECC cell array in response to the ECC control signal; and outputting the corrected error bit data.

15. A semiconductor memory device comprising:

a memory cell array arranged in blocks, each of the blocks having memory cells therein, each of the memory cells having an associated amount of retention time the memory cell can store data without a refresh operation before failing; and a processor and a memory, the memory containing computer readable code that, when executed by the processor, configures the processor to, determine the retention time of the memory cells at least two different refresh rates, assign one of the blocks having a greater number of memory cells with a relatively lower retention time as a first block, and assign one of the blocks having a greater number of memory cells with a relatively higher retention time as a second block, and repair fail cells in the first and second block while operating the memory cells at a lower one of the at least two different refresh rates such that the memory cells in each of the first block and the second block have a same refresh rate.

16. The semiconductor memory device of claim 15, wherein the processor is configured to repair the fail cells by, repairing the fail cells of the first block by substituting the fail cells of the first block with redundancy cells associated therewith; and repairing the fail cells of the second block using an error correction code (ECC).

17. The semiconductor memory device of claim 16, wherein the fail cells of the first block are not repaired using the ECC.

18. The semiconductor memory device of claim 16, wherein the processor is configured to, store, in the memory, information indicating which of the blocks is the second block, and selectively perform an ECC operation using the ECC code based on the information and an address associated with an access request.

19. The semiconductor memory device of claim 18, wherein the information is a most significant bit of the second block.

20. The semiconductor memory device of claim 15, wherein the memory comprises a three-dimensional memory array.

21. The semiconductor memory device of claim 20, wherein the three-dimensional memory array comprises a non-volatile memory that is monolithically formed in one or more physical levels of memory cells having active areas disposed above a silicon substrate.

22. The semiconductor memory device of claim 20, wherein the three dimensional memory array comprises a plurality of memory cells, each of the memory cells including a charge trap layer.

23. The semiconductor memory device of claim 20, wherein word lines and/or bit lines in the three-dimensional memory array are shared between levels.

* * * * *